United States Patent
Benwadih (10) Patent No.: US 9,548,454 B2
(45) Date of Patent: Jan. 17, 2017

(54) METHOD FOR THE ORIENTED CRYSTALLIZATION OF MATERIALS USING A PARTICLE AS A CRYSTALLIZATION NUCLEUS THAT HAS A SURFACE PARTLY FUNCTIONALIZED WITH AT LEAST ONE GROUP HAVING AN AFFINITY FOR THE MATERIAL TO BE CRYSTALLIZED

(75) Inventor: Mohammed Benwadih, Champigny sur Marne (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 597 days.

(21) Appl. No.: 14/115,613

(22) PCT Filed: Apr. 23, 2012

(86) PCT No.: PCT/IB2012/052026
§ 371 (c)(1),
(2), (4) Date: Dec. 31, 2013

(87) PCT Pub. No.: WO2012/150523
PCT Pub. Date: Nov. 8, 2012

(65) Prior Publication Data
US 2014/0127855 A1 May 8, 2014

(30) Foreign Application Priority Data
May 4, 2011 (FR) .................. 11 53836

(51) Int. Cl.
*C30B 25/04* (2006.01)
*H01L 51/00* (2006.01)
(Continued)

(52) U.S. Cl.
CPC ..... *H01L 51/0012* (2013.01); *H01L 21/02356* (2013.01); *H01L 51/0003* (2013.01); *H01L 51/0558* (2013.01)

(58) Field of Classification Search
CPC .......... C30B 25/00; C30B 25/02; C30B 25/04; C30B 25/16; C30B 25/18; C30B 25/186; H01L 21/02356; H01L 51/0002; H01L 51/0003; H01L 51/0004; H01L 51/0005; H01L 51/0012
(Continued)

(56) References Cited

U.S. PATENT DOCUMENTS

| 2007/0243658 A1* | 10/2007 | Hirai .................. H01L 51/0004 438/99 |
| 2007/0252229 A1 | 11/2007 | Fujimori et al. ............. 257/489 |
| 2009/0101893 A1 | 4/2009 | Halls et al. ..................... 257/40 |

OTHER PUBLICATIONS

International Search Report and Written Opinion issued PCT Application No. PCT/IB2012/052026, mailed Jun. 25, 2012.
(Continued)

*Primary Examiner* — Kenneth A Bratland, Jr.
(74) *Attorney, Agent, or Firm* — Norton Rose Fulbright US LLP (57) ABSTRACT

Method for the oriented crystallization of materials. The present invention relates to a method useful for orienting the crystallization of a material over a surface zone of at least one face of a substrate, comprising at least the steps consisting in: i. determining, on said face, the surface over which the crystalline deposit must be formed, referred to as the zone of interest, ii. depositing, on said face and at the periphery of said zone of interest, at least one particle dedicated to forming a crystallization nucleus, iii. bringing said particle into contact with at least said material to be crystallized, iv. exposing at least said point of contact between said particle and said material to be crystallized to conditions favorable to the crystallization of said material, said method being characterized in that the surface of said particle is partly functionalized by at least one group having an affinity for said material to be crystallized, said group
(Continued)

possessing at least one unit having a chemical nature identical or similar to at least one portion of the chemical structure of said material to be crystallized, and in that said particle is deposited in step ii. so as to expose said group opposite the face to be crystallized.

22 Claims, 2 Drawing Sheets

(51) Int. Cl.
*H01L 21/02* (2006.01)
*H01L 51/05* (2006.01)

(58) Field of Classification Search
USPC .................. 117/4–5, 84, 87–90, 94–95, 101, 117/105–106, 902, 913
See application file for complete search history.

(56) References Cited

OTHER PUBLICATIONS

French Preliminary Search Report and Written Opinion issued in French Patent Application No. FR 1153836, issued Nov. 17, 2011.

\* cited by examiner

METHOD FOR THE ORIENTED CRYSTALLIZATION OF MATERIALS USING A PARTICLE AS A CRYSTALLIZATION NUCLEUS THAT HAS A SURFACE PARTLY FUNCTIONALIZED WITH AT LEAST ONE GROUP HAVING AN AFFINITY FOR THE MATERIAL TO BE CRYSTALLIZED

CROSS-REFERENCE TO RELATED APPLICATIONS

This application is a national phase application under 35 U.S.C. §371 of International Application No. PCT/IB2012/052026 filed 23 Apr. 2012, which claims priority to French Patent Application No. 1153836 filed 4 May 2011. The entire contents of each of the above-referenced disclosures is specifically incorporated herein by reference without disclaimer.

The present invention relates to the field of the crystallization of materials and aims in particular to provide a method that is of use for controlling and orienting the formation of a crystalline deposit on a material at the surface of a substrate.

It also relates to the devices, for example electronic or optoelectronic devices, comprising a crystalline material, in particular in the form of a thin film, obtained according to such a method.

Nowadays, many areas of activity, like for example specialty chemistry, pharmacy or else microelectronics, use materials in the form of crystals. Organic semiconductors are currently experiencing considerable expansion in the world of electronics and information technology. They can in fact replace silicon in the fabrication of electronic or optoelectronic devices such as, for example, organic electroluminescent devices, organic photovoltaic devices and organic transistors.

The crystallization process implemented in order to obtain such crystals industrially is very important since it conditions their structure (habits, size, etc.) and their purity, and consequently exerts great influence over their resulting physical, chemical and/or electronic properties.

In the electronics field, it is also generally sought to obtain crystals, in particular in the form of thin films, from organic or inorganic materials, in which the crystallization is homogeneous and preferably controlled.

In fact, the quality of the crystals, and more particularly the structural order of the crystalline deposit, is essential. Thus, for an organic transistor using a crystalline material, it is advisable to avoid, in the zone known as the "conducting channel", a nonhomogeneous orientation of the crystals, defects such as grain boundaries, differences in grain size, etc. These irregularities, because of the structural disruption that they create, can greatly degrade the mobility of the charge carriers, and therefore the electrical conductivity within the crystalline material.

Unfortunately, conventional techniques for depositing a crystalline film at the surface of a substrate, such as solution deposition, vapor deposition, spin coating, evaporation deposition and roll coating, just like conventional printing techniques such as inkjet, do not make it possible to obtain crystalline structures that are of suitable size and sufficiently homogenous to confer good electrical properties on the organic semiconductor.

It should be noted that this problem also arises similarly with materials other than organic semiconductors, and in particular with other materials for electronics, such as, for example, organic dielectrics (in particular polystyrene) or inorganic alloys (in particular alloys of the In Cu Ga Se type, used in photovoltaic devices).

The applications of organic semiconductors therefore currently remain limited from the viewpoint of their low electrical conductivity, which is a direct consequence of a nonoptimized structural organization of the organic semiconductor at the level of the crystalline deposit formed.

Two alternatives are mainly considered at the current time for improving the structural order of organic semiconductors, in particular in thin films.

The first consists in heating the substrate, generally prior to the step of depositing the organic semiconductor, in order to promote organized growth of the crystals of the organic semiconductor.

However, such a heating step can irreversibly damage some of the constituents of the intended device. It also necessarily increases the energy costs of fabrication, and also the fabrication time.

The second consists in designing new organic-semiconductor molecules from already known molecules, so as to provide these new organic-semiconductor molecules with a better crystallization ability.

However, the designing of new molecules is generally very expensive. What is more, the modification of the molecular structure of organic semiconductors can be prejudicial to the electric and/or mechanical properties of the material in the resulting device. In addition, the modification of the molecular structure of the organic semiconductor can also affect its physicochemical properties, for example its solubility.

In order to compensate for these drawbacks, other crystallization techniques have already been proposed.

For example, document US 2007/0243658 describes a method of producing a crystalline organic semiconductor thin film on a substrate comprising a first step of coating said substrate with a solution of said organic semiconductor, followed by a step of crystallizing said organic semiconductor, initiated from the extremity of said coating.

More recently, document US 2009/0101893 has described a method for producing a thin-film organic transistor which involves "seeding" the surface which is to be crystallized with crystallization sites intended to initiate the crystallization of a consecutive deposit of organic semiconductor.

Thus, it would be advantageous to have a novel method allowing organized and directed growth of the semiconductor to be crystallized in order to avoid in the channel any obstacle to electrical conduction, for the purpose of improving the electrical performance levels of the resulting transistor.

The present invention aims precisely to provide a novel method useful for orienting the crystallization of a material at the surface of at least one face of a substrate.

It aims in particular to allow the production of a crystalline deposit, in particular in the form of a thin film, in which the homogeneity and the orientation of the crystallization are optimized in at least one predetermined zone referred to as the "zone of interest".

Thus, according to a first of its aspects, the present invention relates to a method useful for orienting the crystallization of a material over a surface zone of at least one face of a substrate, comprising at least the steps consisting in:

i. determining, on said face, the surface over which the crystalline deposit must be formed, referred to as the zone of interest, ii. depositing, on said face and at the periphery of said zone of interest, at least one particle dedicated to forming a crystallization nucleus, iii. bringing said particle into contact with at least said material to be crystallized, iv. exposing at least said point of contact between said particle and said material to be crystallized to conditions favorable to the crystallization of said material, said method being characterized in that the surface of said particle is partly functionalized with at least one group said to have an affinity for said material to be crystallized, said group possessing at least one unit having a chemical nature identical or similar to at least one part of the chemical structure of said material to be crystallized, and in that said particle is deposited in step ii. so as to expose said group opposite the zone of interest.

Surprisingly, the inventors have noted that it is possible to orient the crystallization by means of a functionalized particle deposited at the surface over which the crystalline deposit must be formed.

Indeed, in the context of the present invention, the partially functionalized molecule will make it possible to initiate and orient the germination and/or the growth of the material to be crystallized, in a manner which is localized, oriented and organized according to the direction of the functionalized part of the surface of the particle.

The method of the invention proves to be advantageous in several respects. First of all, it makes it possible to manage and control the starting point of the crystallization, but also the direction of growth of the crystallization.

The crystalline material obtained by virtue of the method according to the invention is homogeneous, organized with a very high order factor and oriented over the zone of interest.

According to one advantageous embodiment, this crystalline deposit can even consist of a single monocrystalline grain of the material under consideration.

Thus, in the case where the material to be crystallized is an organic semiconductor, the method according to the invention makes it possible to obtain a crystalline deposit of very good quality, which exhibits very good charge carrier mobility, and therefore very satisfactory electrical properties, in the zone of interest.

Finally, the method according to the invention has the advantage of being easy to implement, insofar as it is compatible with the use of conventional deposition or printing techniques, and of thus being inexpensive.

According to another of its aspects, the invention also relates to a device, for example a photovoltaic or photoconductive device, comprising a crystalline deposit, in particular in the form of a thin film, obtained by means of the method according to the invention. These are advantageously transistors, in particular field-effect transistors, and diodes.

Other characteristics, variants and advantages of the method according to the invention will emerge more clearly on reading the description, the examples and the figures which follow, and which are given by way of nonlimiting illustration.

In the remainder of the text, the expressions "between . . . and . . . ", "ranging from . . . to . . . " and "varying from . . . to . . . " are equivalent and are intended to mean that the limits are included, unless otherwise mentioned.

Unless otherwise mentioned, the expression "containing/comprising an" should be understood as "containing/comprising at least one".

Method

Step (I)

The method according to the invention involves, firstly, determining, on the face of the substrate under consideration, a particular surface zone corresponding to the surface over which the crystalline deposit of the material under consideration is intended to be formed.

Substrate

In the context of the present invention, the term "substrate" refers to a base structure at the surface of which the crystalline deposit of the material under consideration according to the invention is formed.

The method according to the invention can advantageously be carried out on varied substrates.

This substrate can therefore be of very diverse organic or inorganic nature, or even of composite nature, i.e. formed of several distinct materials.

The substrate may thus be based on silicon, glass, a metal and/or a resin and generally be in the form of a plate, a sheet or a film. It will more particularly be a resin-based substrate.

By way of example of materials capable of forming such a substrate, mention may in particular be made of silica, silicon, polyethylene terephthalate (PET), polyethyl naphthalate (PEN), polyimide (PI), polyetherimide (PEI), polyethersulfone (PES), polysulfone (PSF), polyphenylene sulfide (PPS), polyether ether ketone (PEEK), polyacrylate (PA), polyamide imide (PAD, polystyrene, polyethylene, polypropylene, a polyamine resin, a carbonate resin or else a cellulose-based resin.

It may in particular be a composite material formed by conductive, in particular metal, zones, placed side by side with insulating zones.

The substrate can, where appropriate, undergo, prior to its treatment according to the invention, one or more transformations dedicated, for example, to conferring on it particular specificities such as, for example, a functionalization with one or more secondary materials, for instance metals for forming one or more electrodes.

Thus, the method according to the present invention proves to be particularly advantageous for forming thin films, for example of organic semiconductors, required in the electronics field, and in particular the transistor field, as illustrated in the example which follows.

Zone of Interest

The surface zone over which the crystalline deposit must be formed is referred to as the "zone of interest" in the context of the present invention.

For obvious reasons, there is always a zone in which the crystalline deposit must be as homogeneous as possible, and in particular as free of crystal defects as possible.

The term "crystal defect" is intended in particular to denote the interfaces between two crystals in a polycrystalline structure (also known as grain boundaries).

The "zone of interest" within the meaning of the invention can thus be defined as being the surface where the crystalline deposit must be as uniform as possible, or even consist of a single monocrystalline grain.

Examples of "zones of interest" within the meaning of the invention are indicated hereinafter, by way of nonlimiting illustration.

Thus, when the material to be crystallized is an organic semiconductor, the "zone of interest" within the meaning of the invention is the surface within which an electron current or a hole current must be transported.

Thus, in the particular case of a transistor, the "zone of interest" within the meaning of the invention associated with a material to be crystallized of organic semiconductor type is the zone of the channel between the source and drain electrodes.

Other examples of zones of interest within the meaning of the invention are found in particular in diodes, capacitors, in particular MIS (metal/insulator/semiconductor) capacitors, or else optical detectors.

Step (ii)

The method according to the invention comprises at least one second step (ii) consisting in depositing, on said face and at the periphery of said zone of interest, at least one particle dedicated to forming a crystallization nucleus.

Functionalized Particle According to the Invention

According to one of the aspects of the invention, the particle dedicated to forming a crystallization nucleus has a part of its surface functionalized with at least one group having an affinity for said material to be crystallized.

It can have a size ranging from 10 nm to 100 µm, or even greater than 100 µm.

The size of the particle can be adjusted to the size of the zone of interest in order to provide better crystallization in this zone.

For example, the particle may have a size close to the size of the side of the zone of interest where it will be positioned: the crystallization will thus propagate homogeneously over the entire surface.

Its shape can also be adjusted: for example, a slender shape for a parallelogram-shaped zone of interest.

Finally, the particles can be distributed along one of the sides of the zone of interest in order to also make homogeneous the growth front.

It may be a particle chosen from semiconductive particles, such as Si, Ge or pentacene particles; insulating particles such as silica, polystyrene or Teflon® particles; conductive particles such as Ni, PDOT (poly(3,4-ethylenedioxythiophene)) or ITO (indium tin oxide) particles, and ceramic particles such as barium titanate $BaTiO_3$ particles.

Preferably, said particle is inorganic. In particular, it may be totally or partially formed from oxide, advantageously from silica, from alumina, from barium titanate ($BaTiO_3$).

According to one particular embodiment, the particle is a silica particle.

As previously mentioned, the particle is functionalized, on a part of its surface, with a group having an affinity for the material to be crystallized.

More particularly, the expression "group having an affinity for said material to be crystallized" is intended to mean, in the context of the invention, a group possessing at least one unit having a chemical nature identical or similar to at least one part of the chemical structure of said material to be crystallized.

The nature of the group for functionalizing the particle, and more particularly of said unit carried by this group, is of course chosen from the viewpoint of the material to be crystallized that is under consideration.

In particular, in the context of the implementation of the method of the invention for the crystallization of a material of aromatic chemical nature, said functionalizing group can advantageously possess an aromatic unit, in particular a phenyl unit.

Preparation of the Partially Functionalized Particle

A partially functionalized particle according to the invention can be prepared according to functionalization techniques known to those skilled in the art.

The functionalization with said specific group previously described can thus be carried out by grafting, onto said part of the surface of the particle, a molecule comprising said chemical unit under consideration for constituting a self-assembled monolayer, also known as SAM. The SAM molecule has in particular, in addition to the specific group, at least one "reactive" function capable of allowing it to graft to the surface of the particle.

Of course, the chemical unit of the group under consideration according to the invention is completely inert with respect to the surface of said particle to be functionalized.

The term "inert", also without distinction referred to as "nonreactive", is intended to mean that said unit does not react or interact, or does not create an action, with the surface to be functionalized.

At the end of the grafting of the SAM, the particle exhibits part of its surface functionalized with said groups possessing the specific chemical unit.

According to a first embodiment variant, the functionalization of the surface under consideration of the particle can be carried out directly, for example by treatment under vacuum, by depositing an SAM on the part of the surface to be functionalized.

The particles can thus already have a surface comprising functions capable of interacting with said reactive function of the molecule carrying said group under consideration, in order to allow grafting thereof.

Alternatively, the functionalization of a part of the surface of the particle can require a prior treatment of said part of surface of the particle in order to generate thereon functions capable of interacting with said reactive function of the SAM in order to allow grafting thereof.

More particularly, the interaction of the reactive function of said SAM and of the function generated on said surface of the particle makes it possible to form a covalent bond between said functions.

By way of example, the functionalization of a part of the surface of a particle can be carried out as described hereinafter and illustrated in FIG. 1.

The particle to be functionalized (1), for example a silica particle, can be pretreated, for example via a plasma treatment, in particular via a dioxygen plasma (2), so as to generate hydroxyl functions (3) on the part of the surface of the particle exposed to the plasma.

The functionalization of said surface with said groups is then performed by bringing said surface into contact with a molecule carrying said group exhibiting said unit having an affinity for the material to be crystallized, for example a phenyl radical for aromatic materials, and a reactive function capable of interacting with a hydroxyl function of the surface so as to form a covalent bond.

The particle which has hydroxyl functions on a part of its surface is, for example, immersed in a solution comprising the SAM molecule.

The SAM molecule (4) may, for example carry, in addition to the aromatic, in particular phenyl, unit of interest, at least one silane or chlorine or isocyanate function, capable of interacting with a hydroxyl function of the surface via a silanization, chloride-silica or isocyanate-silica reaction, so as to form a covalent bond.

Such a molecule may in particular be phenyltriisopropylsilane or phenyl-trimethoxysilane, preferably phenyltriisopropylsilane.

At the end of this functionalization treatment, the final particle (5) obtained is functionalized, on the part of its surface previously carrying hydroxyl functions, with groups possessing a phenyl unit (6).

Of course, those skilled in the art will be able to implement any other technique suitable for functionalizing a part of the surface of a particle with a group carrying a unit that is appropriate from the viewpoint of the material to be crystallized.

Bifunctionalization of the Particle

According to one embodiment variant, the particle is bifunctionalized.

The term "bifunctionalized" is intended to mean that two distinct parts of the surface of the particle are functionalized with distinct groups.

More particularly, in addition to the part functionalized with said group having an affinity for the material to be crystallized, said particle may be functionalized on another part of its surface with a group devoid of affinity for said material to be crystallized.

According to one particularly advantageous embodiment, said groups having an affinity for the material to be crystallized and said groups devoid of affinity for said material to be crystallized are placed on different, preferably opposite, faces of said particle.

Thus, according to one particularly advantageous embodiment, the particle has two very different faces, one face which will exhibit an affinity with said material to be crystallized and another face which will strongly repel said material to be crystallized.

Said groups devoid of affinity for the material to be crystallized are such that no crystallization can be initiated when said material to be crystallized is brought into contact with the part of the surface of the particle functionalized with said group devoid of affinity for the material to be crystallized.

The choice of the group devoid of affinity for said material to be crystallized and of implementation of a suitable bifunctionalization technique fall within the competence of those skilled in the art.

The bifunctionalization of the particle may, for example, be carried out via two consecutive plasma treatment steps, as described more particularly in the subsequent text.

Of course, the nature of the group devoid of affinity for the material to be crystallized depends on the nature of the material to be crystallized.

By way of example, for a material to be crystallized which is of aromatic chemical nature, said group devoid of affinity can represent a fluorine atom or an amine, in particular a fluorine atom.

For example, in the previously described case of the functionalization of the particle with a group carrying a phenyl unit, the particle previously functionalized by a part of its surface with hydroxyl functions can, prior to its introduction into the solution comprising the SAM molecule, be exposed to a fluorinated plasma, so as to functionalize the part of its surface not comprising hydroxyl functions, with fluorine atoms.

The particle obtained is thus functionalized with hydroxyl functions on one of its faces and with fluorine atoms on the other face. The particle is then immersed in a solution comprising the molecule of silane derivative type, in particular phenyltriisopropylsilane or phenyltrimethoxysilane. The fluorine, unlike the hydroxyl functions, is not capable of interacting with a silane function of the molecule used. Consequently, the molecule can be grafted only on the part of the surface of the molecule which comprises hydroxyl functions.

At the end of this treatment, the final particle exhibits a part of its surface functionalized with groups possessing a phenyl unit and another part of its surface comprising fluorine atoms.

Deposition of Said Particle

As previously mentioned, according to one of the aspects of the invention, the particle is deposited according to step (ii) on said face so as to expose said group having an affinity for the material to be crystallized, opposite the zone of interest.

In the context of the present invention, said particle is deposited outside the zone of interest, more particularly at the periphery of the zone of interest.

Those skilled in the art will be able to implement the appropriate techniques for transferring the particle to the desired position on said face and according to the desired orientation.

The particle may be deposited according to the desired orientation in step (ii) at the surface of said face by various methods, in particular by screen printing, inkjet, stamping or vacuum deposition.

According to one particular embodiment, it can be deposited using a stamping pad, in particular an elastomer stamping pad, and more particularly a polydimethyl-siloxane (PDMS) stamping pad.

Figure 2:
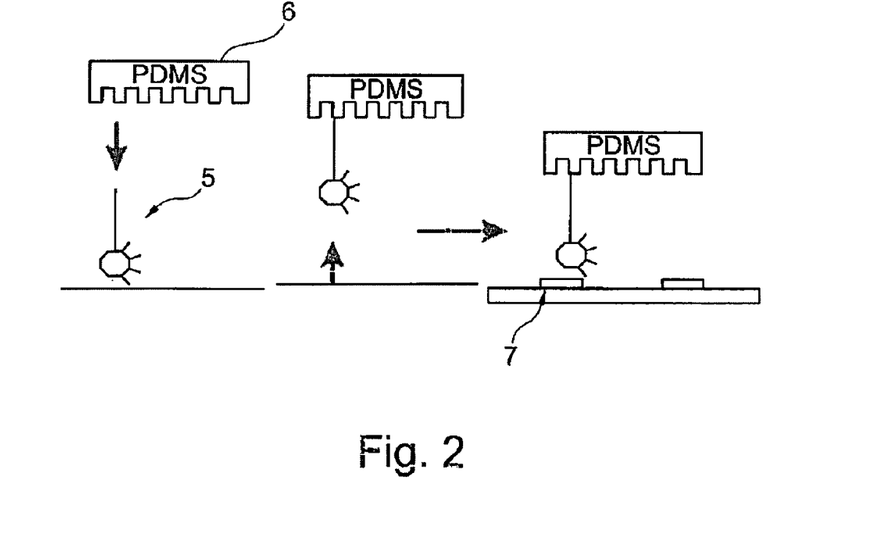
FIG. 2: Schematic representation of the deposition of the functionalized particle using a PDMS stamping pad on one of the source or drain electrodes of a transistor.

FIG. 2 represents schematically the transfer of the partially functionalized particle (5) using a PDMS stamping pad (6) and the deposition thereof on one of the source or drain electrodes (7) of a transistor.

Step (iii)

The method of the invention also comprises a third step (iii) consisting in bringing said particle into contact with at least said material to be crystallized.

Material to be Crystallized

The materials under consideration in the context of the invention may be organic or inorganic materials which have a high added value in the electronics field when they are in a crystalline form.

They may in particular be organic or inorganic materials which have insulating or conductive properties in the crystalline state.

By way of example of such materials, mention may in particular be made of organic dielectrics (in particular polystyrene), inorganic alloys (in particular alloys of the In Cu Ga Se type, used in photovoltaic devices) or else organic semiconductors, in particular as described hereinafter.

According to one particular embodiment, they are materials capable of crystallizing from a liquid solution.

Organic Semiconductor

According to one preferred embodiment, the material under consideration according to the invention is an organic semiconductor.

The organic semiconductors under consideration in the context of the present invention may be of two types.

They may be low-molecular-weight molecules (commonly referred to as "small molecules"), and in particular molecules having a molecular weight of less than 1000 g/mol, or polymers consisting of macromolecules of higher molecular weight.

These two types of organic semiconductors have in common the fact that they provide a conjugated system originating from the alternation of single and double carbon-carbon bonds.

By way of low-molecular-weight organic semiconductor, mention may, for example, be made of those of polyacene, oligothiophene or phthalocyanine type.

By way of polymeric organic semiconductor, mention may, for example, be made of those of polyacetylene, polyphenylene, polythiophene or poly(phenylene/vinylene) type.

It may in particular be an organic semiconductor chosen from one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, poly(para-phenylene)-vinylene and its derivatives, poly(para-phenylene) and its derivatives, polyfluorene and its derivatives, copolymer of polyfluorene-oligothiophene and its derivatives, polythiophene-vinylene and its derivatives, a heterocyclic aromatic copolymer of polythiophene and its derivatives, oligonaphthalene and its derivatives, alpha-5-thiophene oligothiophene and its derivatives, phthalocyanine containing no metal and its derivatives, pyromellitic dianhydride and its derivatives, pyromellitic diimide and its derivatives, perylene tetracarboxylic acid dianhydride and its derivatives, perylene tetracarboxylic diimide and its derivatives, naphthalene tetracarboxylic diimide and its derivatives or naphthalene tetracarboxylic acid dianhydride and its derivatives.

According to one preferred embodiment, the organic semiconductor is chosen from pentacene, tetracene and anthracene. It will preferably be pentacene.

According to one particularly preferred embodiment, step (iii) is carried out by depositing on the zone of interest a continuous film of a solvent medium comprising at least the material to be crystallized, under consideration according to the invention, said film coming into contact with said particle.

The method according to the invention can thus comprise a step consisting in formulating said material to be crystallized in the solute state in the solvent medium.

In the context of this embodiment variant, the film deposited may have a thickness of less than or equal to 1 mm, preferably less than or equal to 200 µm.

This film is more particularly continuous, i.e. one and the same uninterrupted film is deposited on the zone of interest and at least until the contact with said particle.

Such a continuous film can be obtained by any deposition technique known to those skilled in the art for forming thin films on a support.

The choice of a suitable deposition technique falls within the competence of those skilled in the art, who will select the appropriate technique according in particular to the nature of the substrate under consideration and also the desired deposition properties.

According to one embodiment, the film can be deposited by stamping, spin-coating, photoengraving, flexography, inkjet printing, offset printing, or else screen printing.

In the context of this embodiment, the material to be crystallized, present in the solute state in the solvent medium, must be present in a concentration below its critical supersaturation concentration.

The term "critical supersaturation concentration" is intended to denote, within the meaning of the invention, the limit between the solute state and the solid state, i.e. the stage at which the material crosses the solute/solvent medium equilibrium so as to precipitate.

The conditions to be observed so that a supersaturation state can actually be achieved locally on contact with the particle fall within the competence of those skilled in the art.

Of course, the bringing into contact, in step (iii), of said material to be crystallized with said particle deposited in step (ii) can be carried out by other techniques known to those skilled in the art, for instance by vacuum deposition or physical vapor deposition.

Step (iv)

The method according to the invention finally comprises a fourth step (iv) consisting in exposing said point of contact between said particle and said material to be crystallized to conditions favorable to the crystallization of said material.

The conditions to be implemented in order to carry out this step fall within the competence of those skilled in the art.

In the context of the depositing, in step (iii), of a film of a solvent medium comprising said material to be crystallized, step (iv) can in particular comprise at least the evaporation of the solvent medium.

Advantageously, the crystallization is initiated in a localized manner from the particle deposited in step (ii).

Advantageously, the crystallization progresses from said particle in a manner that is organized and oriented according to the direction determined by the part of the surface of the particle functionalized with said group having an affinity for the material to be crystallized.

In particular, the oriented crystalline deposit obtained is homogeneous in the sole direction determined by said surface, with a very high crystallographic order factor, preferably consisting of a single monocrystalline grain of the material to be crystallized.

In the context of the particular embodiment in which the particle is bifunctionalized, as previously described, the crystallization is initiated only on the face comprising said group having an affinity for said material to be crystallized. There is therefore growth of the material to be crystallized, in an oriented and homogeneous manner, only in the direction determined by this face.

Figure 3:
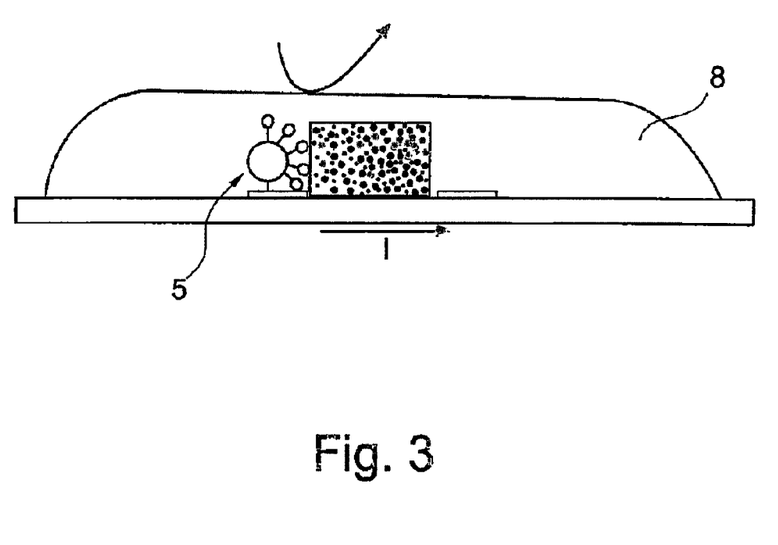
FIG. 3: Schematic representation of the deposition of a continuous film of the solvent medium comprising said material to be crystallized.

FIG. 3 represents schematically the continuous film (8) of a solvent medium comprising said material to be crystallized, deposited on the zone of interest and coming into contact with said particle (5). The crystallization is initiated from said particle and progresses, simultaneously with the evaporation of the solvent medium, homogeneously along the direction (I) determined by the face of the surface of the particle functionalized with said group having an affinity for the material to be crystallized (5).

Applications

The method according to the invention proves to be particularly advantageous for forming thin films, for example of organic semiconductors required in the electronics field, in particular the transistor field.

In particular, according to one embodiment, the material to be crystallized may be an organic semiconductor. Said zone of interest may then be the zone of the channel of a transistor and the particle may be deposited on or at the periphery of at least one of the electrodes of said transistor, said group having an affinity for the material to be crystallized being exposed opposite the zone of the channel.

In this case, the crystal formed will extend into the zone of the channel, preferably in the form of a single monocrystalline grain.

The method according to the invention can also be carried out with regard to any device requiring the presence of a thin film of a material of very good crystalline quality, like, for example, diodes, MIS capacitors and detectors.

For example, the device may be a diode, the material to be crystallized being a semiconductor and the zone of interest being located between the two electrodes.

In particular, said zone of interest is the active zone of a diode and said particle is deposited on or at the periphery of at least one of the electrodes of the diode, said group having an affinity for the material to be crystallized being exposed opposite the active zone.

It may also be a capacitor, the material to be crystallized then being an insulator and the zone of interest being located between the two plates of the capacitor.

According to another embodiment, said material to be crystallized is an insulator, for example polystyrene. Said zone of interest can then be the gate oxide of a transistor or the dielectric of a capacitor and said particle is deposited at the periphery of the electrodes.

Figure 1:
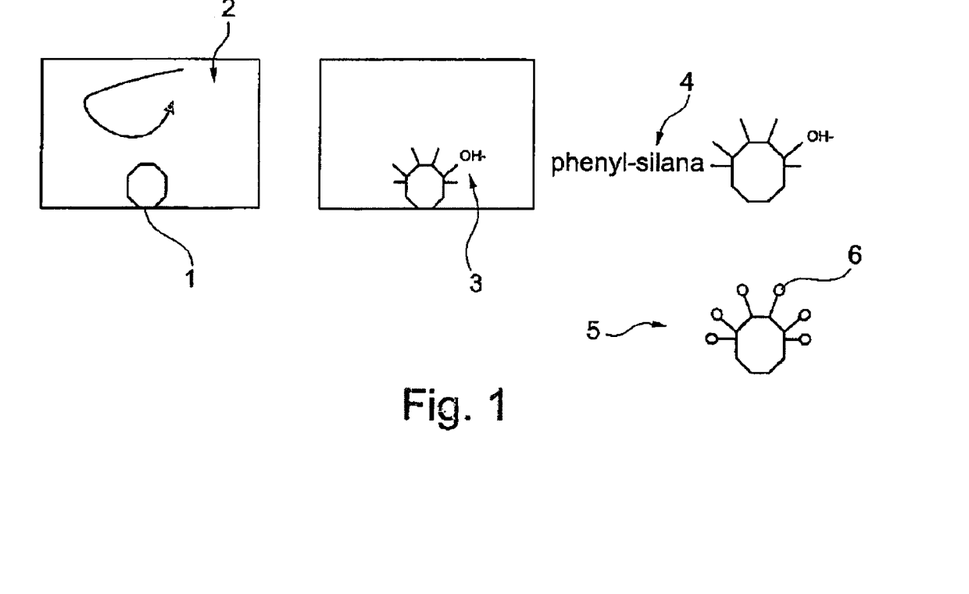
FIG. 1: Schematic representation of the functionalization of a part of the surface of a particle with a group carrying a phenyl unit.

The exemplary embodiments indicated hereinafter or represented in FIGS. 1, 2 and 3 are given only by way of nonlimiting illustration of the invention.

EXAMPLE

A transistor having the following characteristics was prepared by carrying out the method according to the invention.

Deposition of the Source and Drain Electrodes

Electrodes (source and drain) were deposited on a substrate in the form of a plate of PEN (polyethylene naphthalate).

Preparation of a Functionalized Particle According to the Invention

A silica ($SiO_2$) nanoparticle was functionalized on one of its faces with a group possessing a phenyl unit according to the following method.

The silica nanoparticle was subjected to a plasma treatment in an oxygen plasma chamber. This plasma treatment makes it possible to create pendant OH functions on the part of the surface of the particle facing the plasma.

The particle is then immersed in a solution of phenyltriisopropylsilane molecule. The interaction of the silane functions of the molecules with the hydroxyl functions results in grafting of the molecules onto the part of the surface previously functionalized with the hydroxyl functions. The particle obtained exhibits a part of its surface functionalized with groups possessing a phenyl unit.

Particle Deposition

The particle obtained at the end of the previous step was deposited at the surface of one of the source or drain electrodes of the transistor, using a PDMS (polydimethylsiloxane) stamping pad, the face, of the nanoparticle, treated with said groups having a phenyl unit being oriented toward the conducting channel.

Bringing the Particle into Contact with the Material to be Crystallized

The semiconductor (liquid pentacene) was deposited in the form of a film over the entire plate.

The solvent medium was then evaporated off at 60° C. for 3 minutes and then at 100° C. for 1 minute.

The crystallization was initiated on contact of the particle. It is oriented and organized according to the direction of the face of the particle functionalized with the groups carrying phenyl units.

Deposition of the Gate Dielectric and of the Conductive Gate

Finally, the dielectric (polystyrene) was deposited by screen printing and then Ag was deposited by inkjet so as to constitute the transistor gate.

The invention claimed is:

1. A method useful for orienting the crystallization of a material over a surface zone of at least one face of a substrate, comprising at least the steps consisting in:
   (i) determining, on said face, the surface over which the crystalline deposit must be formed, referred to as the zone of interest;
   (ii) depositing, on said face and at the periphery of said zone of interest, at least one particle dedicated to forming a crystallization nucleus;
   (iii) bringing said particle into contact with at least said material to be crystallized; and
   (iv) exposing at least said point of contact between said particle and said material to be crystallized to conditions favorable to the crystallization of said material;
   the surface of said particle being partly functionalized with at least one group having an affinity for said material to be crystallized, said group possessing at least one unit having a chemical nature identical to at least one part of the chemical structure of said material to be crystallized, and in that said particle is deposited in step (ii) so as to expose said group opposite the zone to be crystallized.

2. The method as claimed in claim 1, wherein the crystalline deposit formed on the zone of interest consists of a single monocrystalline grain of said material.

3. The method as claimed in claim 1, wherein said particle is inorganic.

4. The method as claimed in claim 1, wherein said particle is totally or partially formed from an oxide.

5. The method as claimed in claim 1, wherein said particle is totally or partially formed from silica, from alumina or from barium titanate.

6. The method as claimed in claim 1, wherein said particle is a silica particle.

7. The method as claimed in claim 1, using a particle of which the surface is partly functionalized with a group possessing at least one aromatic unit, for a material to be crystallized of aromatic chemical nature.

8. The method as claimed in claim 7, wherein said partially functionalized particle is obtained by grafting, onto a particle exhibiting hydroxyl functions on a part of its surface, a molecule exhibiting, in addition to said group having an aromatic, at least one silane or chlorine or isocyanate function capable of interacting with a hydroxyl function of the surface so as to form a covalent bond.

9. The method as claimed in claim 8, wherein said molecule is phenyltriisopropylsilane or phenyltrimethoxysilane.

10. The method as claimed in claim 8, wherein said particle exhibiting hydroxyl functions on a part of its surface is obtained via a plasma treatment of a nonfunctionalized particle, so as to generate hydroxyl functions on the part of the surface of the particle exposed to the plasma.

11. The method as claimed in claim 1, wherein said particle is also functionalized, on a part of its surface distinct from that functionalized with said group having an affinity for said material to be crystallized, with at least one group devoid of affinity for said material to be crystallized.

12. The method as claimed in claim 11, wherein said groups having an affinity for the material to be crystallized and said groups devoid of affinity for said material are placed on different faces of said particle.

13. The method as claimed in claim 11, wherein said groups having an affinity for the material to be crystallized and said groups devoid of affinity for said material are placed on opposite faces of said particle.

14. The method as claimed in claim 1, wherein said particle is deposited according to the desired orientation in step (ii) at the surface of said face by screen printing, inkjet, stamping or vacuum deposition.

15. The method as claimed in claim 14, wherein said particle is deposited according to the desired orientation in step (ii) at the surface of said face by screen printing, inkjet, stamping or vacuum deposition using an elastomer stamping pad.

16. The method as claimed in claim 1, wherein the bringing of said particle into contact with said material to be crystallized in step (iii) is carried out by depositing on said zone of interest a continuous film of a solvent medium comprising at least said material to be crystallized, said film coming into contact with said particle.

17. The method as claimed in claim 16, wherein step (iv) comprises at least the evaporation of said solvent medium.

18. The method as claimed in claim 1, wherein said material to be crystallized is an organic semiconductor.

19. The method as claimed in claim 1, wherein said zone of interest is the zone of the channel of a transistor and said particle is deposited on or at the periphery of at least one of the electrodes of said transistor, said group having an affinity for the material to be crystallized being exposed opposite the zone of the channel.

20. The method as claimed in claim 1, wherein said zone of interest is the active zone of a diode and said particle is deposited on or at the periphery of at least one of the electrodes of the diode, said group having an affinity for the material to be crystallized being exposed opposite the active zone.

21. The method as claimed in claim 1, wherein said material to be crystallized is an insulator.

22. The method as claimed in claim 4, wherein said zone of interest is the gate oxide of a transistor or the dielectric of a capacitor and said particle is deposited at the periphery of the electrodes.

* * * * *